United States Patent
Liou et al.

(10) Patent No.: US 10,571,796 B2
(45) Date of Patent: Feb. 25, 2020

(54) EXTREME ULTRAVIOLET PHOTOMASK AND METHOD FOR FABRICATING THE SAME

(71) Applicant: United Microelectronics Corp., Hsinchu (TW)

(72) Inventors: En-Chiuan Liou, Tainan (TW); Yu-Cheng Tung, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 102 days.

(21) Appl. No.: 15/585,000

(22) Filed: May 2, 2017

(65) Prior Publication Data

US 2018/0284596 A1  Oct. 4, 2018

(30) Foreign Application Priority Data

Mar. 28, 2017  (TW) .............................. 106110220 A

(51) Int. Cl.
*G03F 1/24* (2012.01)
*G03F 1/52* (2012.01)
*G03F 1/54* (2012.01)
*G03F 1/80* (2012.01)

(52) U.S. Cl.
CPC ............ *G03F 1/24* (2013.01); *G03F 1/52* (2013.01); *G03F 1/54* (2013.01); *G03F 1/80* (2013.01)

(58) Field of Classification Search
CPC ..... G03F 1/24; G03F 1/80; G03F 1/54; G03F 1/52
See application file for complete search history.

(56) References Cited

U.S. PATENT DOCUMENTS

| 5,935,733 A * | 8/1999 | Scott ...................... B82Y 10/00 430/5 |
| 8,110,321 B2 * | 2/2012 | Petrarca .................. G03F 1/26 430/322 |
| 8,968,969 B2 | 3/2015 | Kim et al. |
| 9,280,044 B2 | 3/2016 | Takai |
| 9,558,944 B2 | 1/2017 | Hsu et al. |
| 2002/0192571 A1 * | 12/2002 | Schwarzl ............... B82Y 10/00 430/5 |
| 2012/0045712 A1 * | 2/2012 | Chang ...................... G03F 1/24 430/5 |
| 2012/0129083 A1 * | 5/2012 | Yoshimori ............ G03B 27/42 430/5 |
| 2013/0092655 A1 * | 4/2013 | Yu .......................... B44C 1/227 216/41 |
| 2013/0196256 A1 * | 8/2013 | Ryu ......................... G03F 1/24 430/5 |
| 2014/0272683 A1 * | 9/2014 | Yen ......................... G03F 1/76 430/5 |
| 2015/0331307 A1 * | 11/2015 | Lu ............................ G03F 1/80 430/5 |

FOREIGN PATENT DOCUMENTS

JP  2014-096483  *  5/2014  ............... G03F 1/24

* cited by examiner

*Primary Examiner* — Martin J Angebranndt
(74) *Attorney, Agent, or Firm* — J.C. Patents

(57) ABSTRACT

An extreme ultraviolet (EUV) photomask includes a mask substrate, a reflection layer and a light-absorbing pattern layer. The reflection layer is disposed on the mask substrate, wherein the reflection layer has a concave pattern. The light-absorbing pattern layer is in the reflection layer, to fill the concave pattern. The light-absorbing pattern layer is exposed.

16 Claims, 5 Drawing Sheets

EXTREME ULTRAVIOLET PHOTOMASK AND METHOD FOR FABRICATING THE SAME

CROSS-REFERENCE TO RELATED APPLICATION

This application claims the priority benefit of Taiwan application serial no. 106110220, filed on Mar. 28, 2017. The entirety of the above-mentioned patent application is hereby incorporated by reference herein and made a part of this specification.

BACKGROUND

1. Field of the Invention

The present invention generally relates to semiconductor fabrication, and particularly to the technology of extreme ultraviolet (EUV) photomask.

2. Description of Related Art

In the fabrication process for the semiconductor device in electronic circuit, it usually includes photolithographic and etching processes, so to form the internal structure for the semiconductor device. The photolithographic process needs the light source to irradiate the photoresist and develop the image. The mask pattern is then obtained to serve as the etching mask in the subsequent etching process. However, as the need to increase device density, the size for the pattern structure is accordingly reduced. Therefore, the light source used in the photolithographic process should take the light with shorter wavelength to obtain the capability of higher resolution. Then, the fine structure of the pattern can be well developed with clarity.

The wavelength of EUV is about 13.5 nm. The EUV is the suitable light source in developing the photomask technology, so at satisfy the requirement of high resolution. As to the EUV photomask, usually, the pattern is formed on a reflection layer of high reflectivity, in which the pattern as an example is a light-absorbing material. When the EUV light source is incident onto the EUV photomask with an incident angle, a portion of the light source shooting on the reflection layer is reflected to the photoresist layer and another portion of the light source shooting on the light-absorbing material is absorbed without reflection to the photoresist layer. Thus, the reflection light carries the intended pattern and shoots onto the photoresist layer. The photoresist layer is developed with image and then gets the photoresist pattern, which can be used in the subsequent process, such as etching process or implanting process.

Since the light-absorbing pattern is protruding from the reflection layer and the light is incident with a tilt angle, the light-absorbing pattern would cause a shadow with respect to the incident light, which may affect the line width in an example. This is an issue needed to be concerned in designing the EUV photomask.

SUMMARY OF THE INVENTION

The invention provides a structure of EUV photomask, and can at least reducing the shadow effect, and improve the performance of the EUV photomask.

In an embodiment, the invention provides an EUV photomask, comprising a mask substrate, a reflection layer and a light-absorbing pattern layer. The reflection layer is disposed on the mask substrate, wherein the reflection layer has a concave pattern. The light-absorbing pattern layer is disposed in the reflection layer to fill the concave pattern, wherein the light-absorbing pattern layer is exposed.

In an embodiment, as to the EUV photomask, a top surface of the reflection layer and the light-absorbing pattern layer is flat, or a height of the light-absorbing pattern layer is a concave state.

In an embodiment, as to the EUV photomask, the light-absorbing pattern layer has an equal depth, embedded in the reflection layer.

In an embodiment, as to the EUV photomask, wherein the light-absorbing pattern layer comprises at least two portions with different depths, embedded in the reflection layer.

In an embodiment, as to the EUV photomask, a line width of a pattern of the light-absorbing pattern layer is equal, or not equal in whole.

In an embodiment, as to the EUV photomask, the reflection layer comprises multiple silicon layers and multiple Mo layers, alternately stacked.

In an embodiment, as to the EUV photomask, wherein the reflection layer comprises a cap layer, to serve as a top layer.

In an embodiment, as to the EUV photomask, the light-absorbing pattern layer absorbs EUV light.

In an embodiment, as to the EUV photomask, a sidewall of the concave pattern comprises an indent.

In an embodiment, the invention also provides a method for fabricating extreme ultraviolet photomask. The method comprises proving a mask substrate. And then, a reflection layer is formed on the mask substrate. The reflection layer is patterned to have a concave pattern. A light-absorbing pattern layer is formed on the reflection layer to fill the concave pattern. A top portion of the light-absorbing pattern layer is removed to expose the refection layer.

In an embodiment, as to the method for fabricating EUV photomask, a flat surface is formed on top of the reflection layer and the light-absorbing pattern layer, or a height of the light-absorbing pattern layer is a concave state.

In an embodiment, as to the method for fabricating EUV photomask, the light-absorbing pattern layer has an equal depth, embedded in the reflection layer.

In an embodiment, as to the method for fabricating EUV photomask, the light-absorbing pattern layer comprises at least two portions with different depths, embedded in the reflection layer.

In an embodiment, as to the method for fabricating EUV photomask, a line width of a pattern of the light-absorbing pattern layer is equal, or not equal in whole.

In an embodiment, as to the method for fabricating EUV photomask, the reflection layer comprises multiple silicon layers and multiple Mo layers, alternately stacked.

In an embodiment, as to the method for fabricating EUV photomask, the reflection layer comprises a cap layer, to serve as a top layer.

In an embodiment, as to the method for fabricating EUV photomask, the light-absorbing pattern layer absorbs EUV light.

In an embodiment, as to the method for fabricating EUV photomask, a sidewall of the concave pattern comprises an indent.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to the design of EUV photomask. The EUV photomask has a light-absorbing pattern as intended formed thereon. By irradiating the EUV light on the EUV photomask and the light-absorbing pattern absorbing the EUV light, the reflected light carrying the intended pattern is then further shooting on the photoresist layer of the device for further developing the photoresist layer.

The light-absorbing pattern of the invention is formed in a reflection layer by a form of trench or concave, the light receiving surface of the EUV mask in an example can be a flat surface, so the shadow effect can be reduced and the quality of photolithographic process can be improved.

Several embodiments are provided for describing the invention but the invention is not limited to the embodiments.

Figure 1:
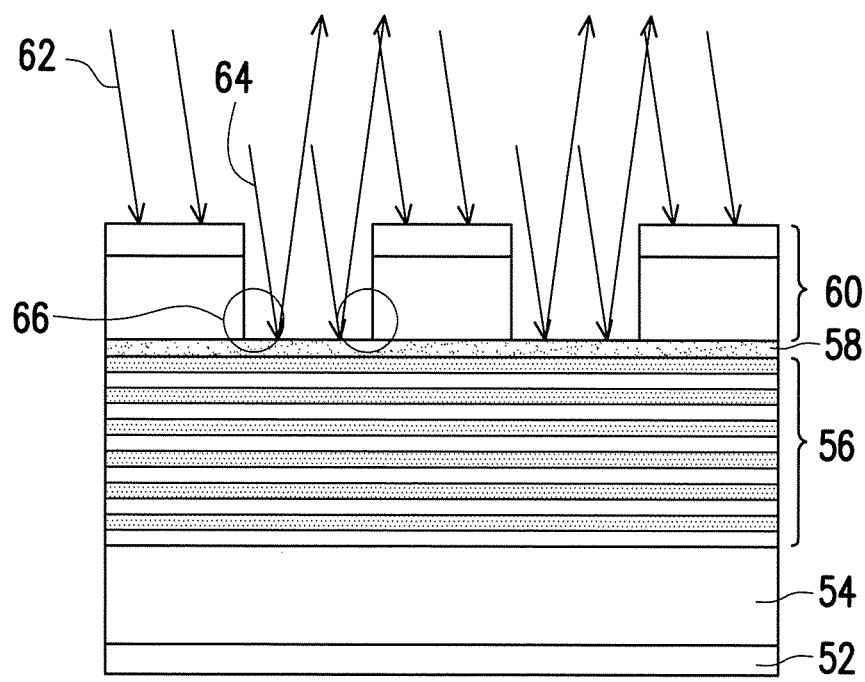
FIG. 1 is a drawing, schematically illustrating a cross-sectional view of an EUV photomask according to the invention.

First, the issues of EUV photomask as concerned by the invention are described. FIG. 1 is a drawing, schematically illustrating a cross-sectional view of an EUV photomask according to the invention. Referring to FIG. 1, the invention has looked into the EUV photomask 50, which includes a mask substrate 54 to serve as the structure base. The material can be quartz in an example. Further, a conductive layer 52 may be also formed at bottom of the mask substrate 54. The material is CrN in an example. The reflection layer 56 is formed on the mask substrate 54. The stacked reflection layer 56 in an example is high reflectivity with a stacked structure from multiple layers. In a further example, it is alternately stacked by multiple silicon layers and multiple Mo layers. A cap layer 58 may further formed on the reflection layer 56 as stacked to serve as the top layer of the reflection layer. In other words, the reflection layer 56 and the cap layer 58 can be treated together as a refection layer. The light-absorbing pattern layer 60 is formed on the cap layer 58.

Here, the light-absorbing pattern layer 60 is protruding from the top surface of the cap layer 58, so that a concave structure is formed between the sidewall of the light-absorbing pattern layer 60. A portion of light 62 of the incident EUV light irradiates onto the light-absorbing pattern layer 60 and then is absorbed. Another portion of light 64 of the incident EUV light irradiates onto the cap layer 58 without covering by the light-absorbing pattern layer 60, so the light is reflected. The bottom region 66 of the sidewall of the EUV photomask 50 cannot receive or reflect the incident light due to blocking, resulting in shadow at the periphery of the pattern.

Figure 2:
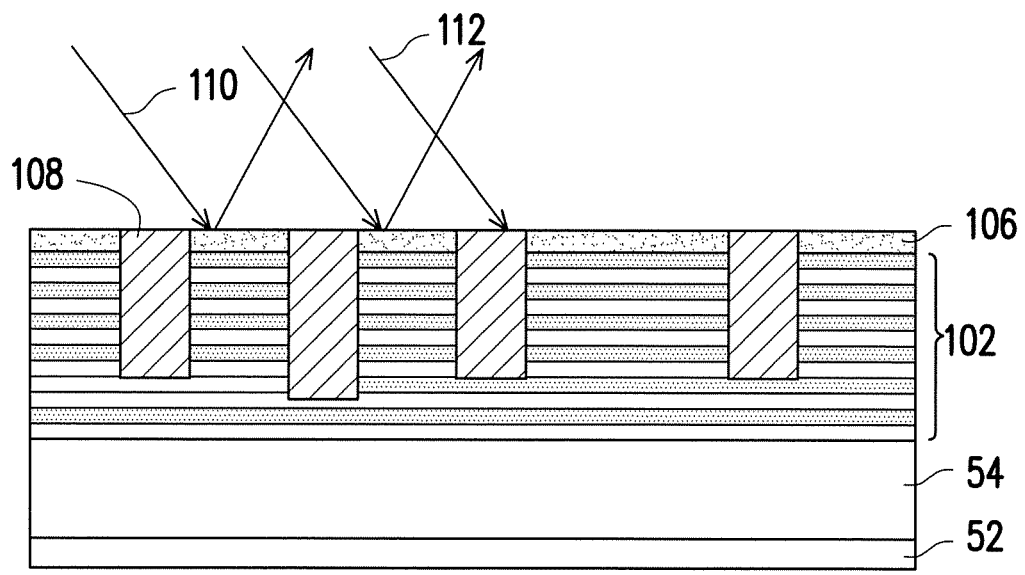
FIG. 2 is a drawing, schematically illustrating a cross-sectional view of an EUV photomask, according to an embodiment of the invention.

After looking into the EUV photomask 50, the invention proposes a EUV photomask, which can effectively reduce the shadow, for example, at the bottom region 66. FIG. 2 is a drawing, schematically illustrating a cross-sectional view of an EUV photomask, according to an embodiment of the invention.

Referring to FIG. 2, an EUV photomask 100 includes mask substrate 54, a reflection layer 102 as multi-layer stacked and a light-absorbing pattern layer 108. The reflection layer 102 as multi-layer stacked is disposed on the mask substrate 54, in which the reflection layer 102 as multi-layer stacked has a concave pattern. The light-absorbing pattern layer 108 is in the reflection layer 102, filling the concave pattern.

For the reflection layer 102 as multi-layer stacked with high reflectivity, in an example, it can be formed by multiple silicon layers and multiple Mo layers, alternately stacked. In addition, if needed, the cap layer 106 can also be formed on the reflection layer 102 as multi-layer stacked, together forming the reflection layer. A top surface of the reflection including the reflection layer 102 with the cap layer 106 and the light-absorbing pattern layer 108 can form a flat surface, the light-absorbing pattern layer 108 is exposed.

A portion of light 110 of the EUV incident light irradiates onto the cap layer 106 of the reflection layer and is reflected. Another portion of light 112 of the EUV incident light irradiates onto light-absorbing pattern layer 108 is absorbed, not reflected. In other words, the cap layer 106 serving as a top layer of the reflection layer 102 as multi-layer stacked, the cap layer 106 is then a part of the reflecting layer.

Here, since a top surface of the reflection layer (including the cap layer 106 and the reflection layer 102 as multi-layer stacked) and the light-absorbing pattern layer 108 is a flat surface, the reflection light is not blocked by the light-absorbing pattern layer 108. As a result, the periphery of the pattern carried by the reflection light can be consistent with the light-absorbing pattern layer 108.

Figure 3:
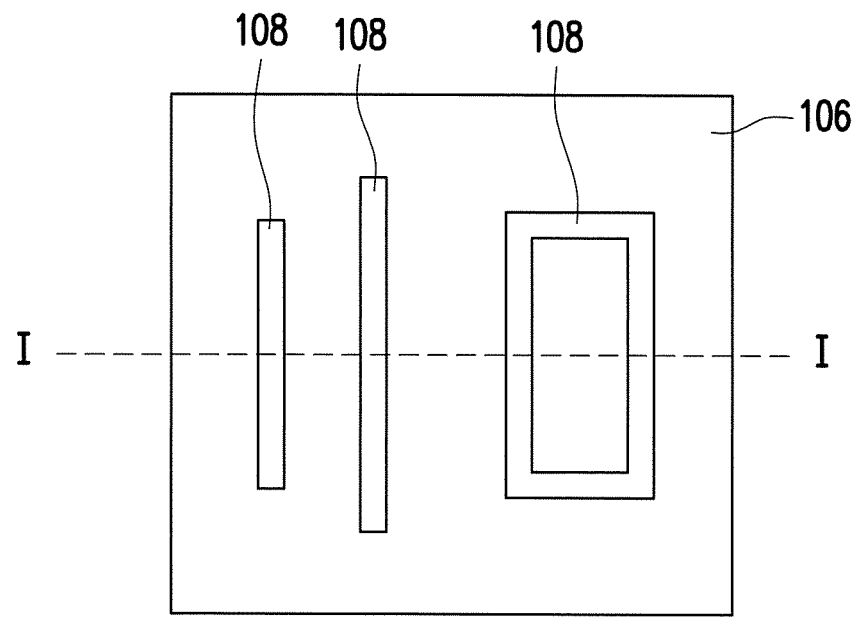
FIG. 3 is a drawing, schematically illustrating a top structure of an EUV photomask, according to an embodiment of the invention.

FIG. 3 is a drawing, schematically illustrating a top structure of an EUV photomask, according to an embodiment of the invention. Referring to FIG. 3, the light-absorbing pattern layer 108 as viewed from top can be a pattern in two-dimensional distribution. A cross-sectional structure cutting along the line I-I would be similar to the structure in FIG. 2.

Further, the actual structure of the light-absorbing pattern layer 108 can be modified according to the actual design, in which the depth, the line width, or the pattern density (pattern loading) can be properly adjusted. Several embodiments about the light-absorbing pattern layer 108 are further provided.

Figure 4:
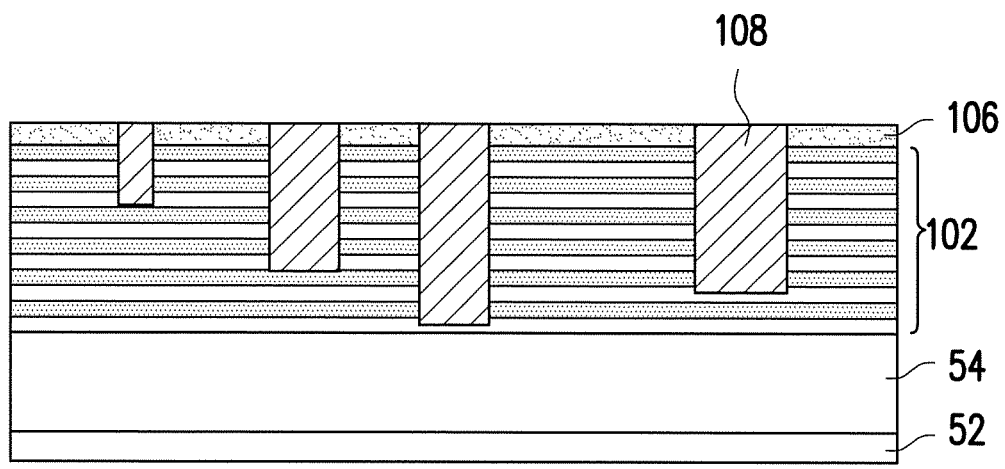
FIG. 4 is a drawing, schematically illustrating a cross-sectional view of an EUV photomask, according to an embodiment of the invention.
Figure 5:
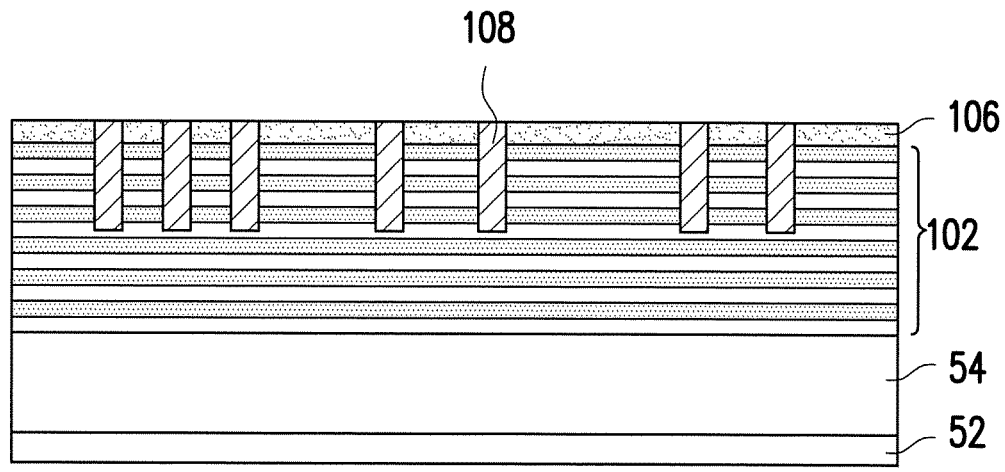
FIG. 5 is a drawing, schematically illustrating a cross-sectional view of an EUV photomask, according to an embodiment of the invention.

FIG. 4 is a drawing, schematically illustrating a cross-sectional view of an EUV photomask, according to an embodiment of the invention. Referring to FIG. 4, the depth of the light-absorbing pattern layer 108 in the reflection layer 102 as multi-layer stacked can be equal. However, it is necessary to be all equal and can be different according to the actual need. In other words, the light-absorbing pattern layer 108 may comprise at least two portions with different depths, embedded in the reflection layer 102 as multi-layer stacked. FIG. 5 is a drawing, schematically illustrating a cross-sectional view of an EUV photomask, according to an embodiment of the invention. Referring to FIG. 5, as to the pattern density of the light-absorbing pattern layer 108, it can also be modified according to the actual design. In an embodiment, even if the depth is equal, the patter distribution is in accordance with the device structure to be formed. The pattern density is not uniform. In other words, the light-absorbing pattern layer 108 and the cap layer 106 of the reflection layer are at the same height, to form a flat surface, in which the depth, line width and the pattern density can be properly adjusted.

Figure 6:
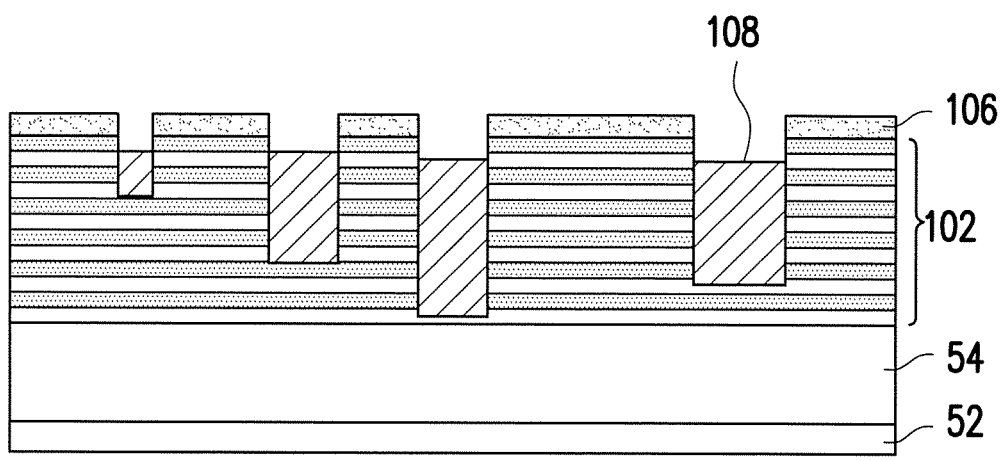
FIG. 6 is a drawing, schematically illustrating a cross-sectional view of an EUV photomask, according to an embodiment of the invention.

In the foregoing embodiments, the example that the light-absorbing pattern layer 108 and the cap layer 106 of the reflection layer are at the same height to form a flat surface is taken for describing the invention. However, it is not necessary to be limited to the flat surface. FIG. 6 is a drawing, schematically illustrating a cross-sectional view of an EUV photomask, according to an embodiment of the invention. Referring to FIG. 6, the light-absorbing pattern layer 108 in height may be lower than the cap layer 106 or the reflection layer 102 as multi-layer stacked. In the embodiment, although the light-absorbing pattern layer 108 is at the concave state, the reflected pattern as intended can still substantially remain.

Figure 7:
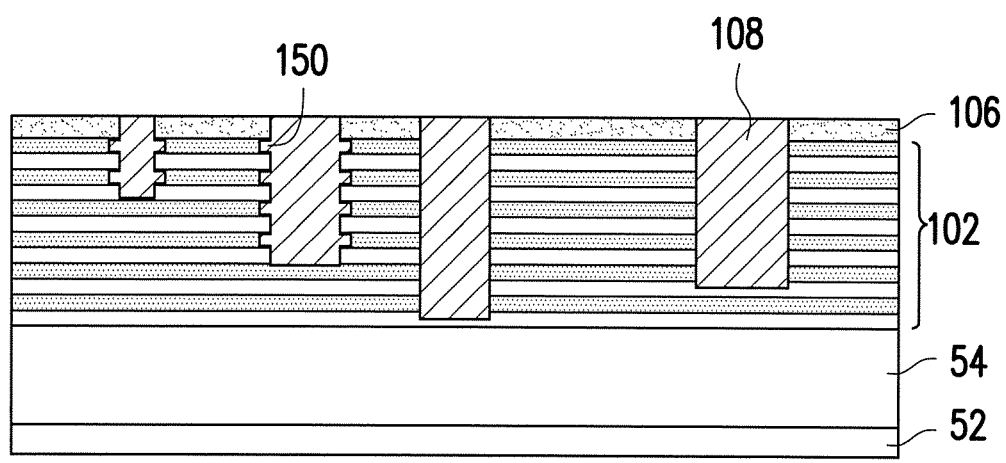
FIG. 7 is a drawing, schematically illustrating a cross-sectional view of an EUV photomask, according to an embodiment of the invention.

Further still, FIG. 7 is a drawing, schematically illustrating a cross-sectional view of an EUV photomask, according to an embodiment of the invention. Referring to FIG. 7, the reflection layer 102 can be patterned to have the concave pattern, in which a sidewall of the concave pattern can further comprise an indent 150 in an embodiment.

Figure 8:
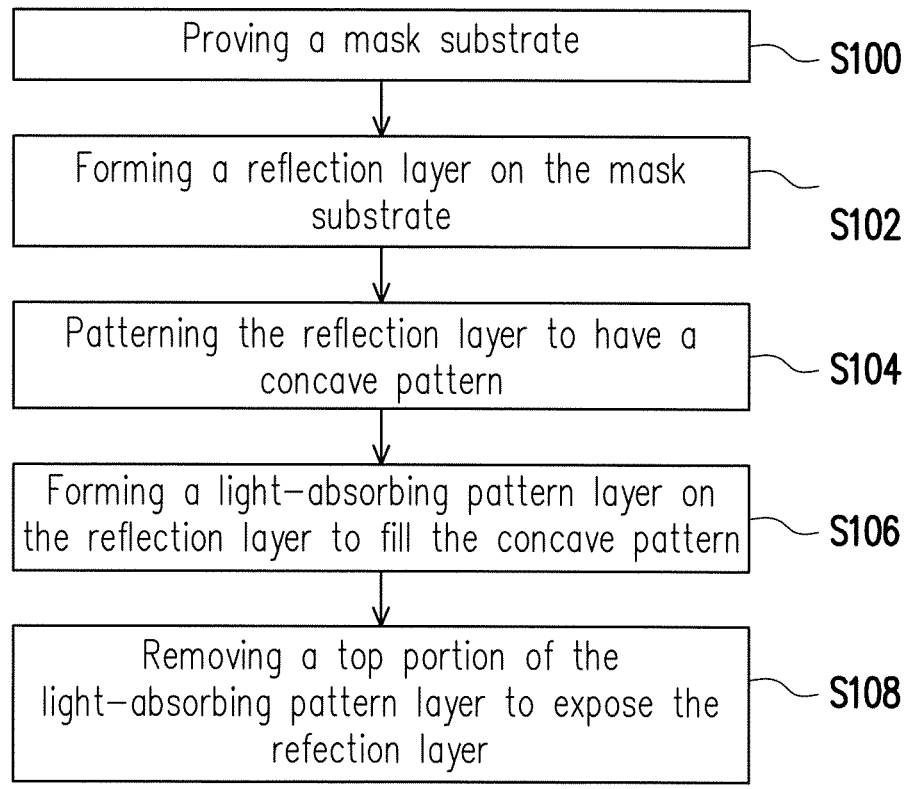
FIG. 8 is a drawing, schematically illustrating processing flow of a method for fabricating EUV photomask, according to an embodiment of the invention.

According to an embodiment of the invention, the invention also provides a method for fabricating extreme ultraviolet photomask. FIG. 8 is a drawing, schematically illustrating processing flow of a method for fabricating EUV photomask, according to an embodiment of the invention. Referring to FIG. 8, in step S100, the method for fabricating EUV photomask comprises proving a mask substrate. And then, in step S102, the method further comprises forming a reflection layer on the mask substrate. In step S104, the method further comprises patterning the reflection layer to have a concave pattern. In step S106, the method further comprises forming a light-absorbing pattern layer on the reflection layer to fill the concave pattern. In step S108, the method further comprises removing a top portion of the light-absorbing pattern layer to expose the refection layer. As also described above, a flat surface can be formed on the reflection layer and the light-absorbing pattern layer. Alternatively, such as FIG. 6, the light-absorbing pattern layer can be properly at a concave state.

The invention has provided an EUV photomask, in which the light-absorbing pattern layer is formed in the EUV photomask. Whereby, the surface of the EUV mask can be flat. The incident light is not blocked by the light-absorbing pattern layer, causing a shadow, which would affect the periphery of the pattern.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An extreme ultraviolet (EUV) photomask, comprising:
    a mask substrate;
    a reflection layer, disposed on the mask substrate, wherein the reflection layer has a concave pattern, wherein the concave pattern at least comprises a first concave pattern having a sidewall without indents and a second concave pattern having a sidewall with indents; and
    a light-absorbing pattern layer, disposed in the reflection layer to fill the concave pattern, wherein the light-absorbing pattern layer is exposed.

2. The EUV photomask as recited in claim 1, wherein a top surface of the reflection layer and the light-absorbing pattern layer is flat, or a height of the light-absorbing pattern layer is a concave state.

3. The EUV photomask as recited in claim 1, wherein the light-absorbing pattern layer includes two or more portions being equal in depth, embedded in the reflection layer.

4. The EUV photomask as recited in claim 1, wherein the light-absorbing pattern layer comprises at least two portions with different depths, embedded in the reflection layer.

5. The EUV photomask as recited in claim 1, wherein a line width of a pattern of the light-absorbing pattern layer is uniform, or not uniform in whole.

6. The EUV photomask as recited in claim 1, wherein the reflection layer comprises multiple silicon layers and multiple Mo layers, alternately stacked.

7. The EUV photomask as recited in claim 1, wherein the reflection layer comprises a cap layer, to serve as a top layer.

8. The EUV photomask as recited in claim 1, wherein the light-absorbing pattern layer absorbs EUV light.

9. A method for fabricating extreme ultraviolet (EUV) photomask, comprising:
    proving a mask substrate;
    forming a reflection layer on the mask substrate;
    patterning the reflection layer to have a concave pattern, wherein the concave pattern at least comprises a first concave pattern having a sidewall without indents and a second concave pattern having a sidewall with indents;
    forming a light-absorbing pattern layer on the reflection layer to fill the concave pattern; and
    removing a top portion of the light-absorbing pattern layer to expose the refection layer.

10. The method as recited in claim 9, wherein a flat surface is formed on top of the reflection layer and the light-absorbing pattern layer, or a height of the light-absorbing pattern layer is a concave state.

11. The method as recited in claim 9, wherein the light-absorbing pattern layer includes two or more portions being equal in depth, embedded in the reflection layer.

12. The method as recited in claim 9, wherein the light-absorbing pattern layer comprises at least two portions with different depths, embedded in the reflection layer.

13. The method as recited in claim 9, wherein a line width of a pattern of the light-absorbing pattern layer is uniform, or not uniform in whole.

14. The method as recited in claim 9, wherein the reflection layer comprises multiple silicon layers and multiple Mo layers, alternately stacked.

15. The method as recited in claim 9, wherein the reflection layer comprises a cap layer, to serve as a top layer.

16. The method as recited in claim 9, wherein the light-absorbing pattern layer absorbs EUV light.

* * * * *